United States Patent

Reddy et al.

[11] Patent Number: 6,157,587
[45] Date of Patent: *Dec. 5, 2000

[54] DATA SENSE ARRANGEMENT FOR RANDOM ACCESS MEMORY

[75] Inventors: Chitranjan N. Reddy, Los Altos Hills; Vipul Patel, San Jose, both of Calif.

[73] Assignee: Alliance Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/965,431

[22] Filed: Nov. 6, 1997

(Under 37 CFR 1.47)

[51] Int. Cl.[7] ....................................................... G11C 7/02

[52] U.S. Cl. ...................... 365/207; 365/208; 365/189.05

[58] Field of Search .................................... 365/205, 207, 365/208, 189.11, 189.05, 190

[56] References Cited

U.S. PATENT DOCUMENTS

| | | | |
|---|---|---|---|
| 4,608,670 | 8/1986 | Duvvury et al. | 365/205 |
| 4,627,033 | 12/1986 | Hyslop et al. | 365/205 |
| 5,127,739 | 7/1992 | Duvvury et al. | 365/189.11 |
| 5,367,486 | 11/1994 | Mori | 365/221 |
| 5,416,371 | 5/1995 | Katayama | 365/205 |
| 5,777,938 | 7/1998 | Nakamura | 365/220 |

*Primary Examiner*—A. Zarabian
*Attorney, Agent, or Firm*—Beyer Weaver & Thomas, LLP

[57] ABSTRACT

A sensing circuit (30) for a random access memory (10) is disclosed. A CMOS sense amplifier (32) is coupled between bit line pairs which connected to I/O lines by a passgate (N4/N5). A pair of cross-coupled transistors (N6/N7) activated in synchronism with the passgate (N4/N5) is also disposed between the bit lines. The I/O line pairs each include a pair of cross coupled p-channel transistors (P4/P5). The combined action of the cross-coupled pairs (N6/N7) and (P4/P5) increase the sensing speed of the sensing circuit (30).

17 Claims, 5 Drawing Sheets

DATA SENSE ARRANGEMENT FOR RANDOM ACCESS MEMORY

TECHNICAL FIELD

The present invention relates generally to semiconductor memory devices and more particularly to sense circuits for random access memories.

BACKGROUND OF THE INVENTION

Random access memories (RAMs) typically include a plurality of memory cells arranged in an array of rows and columns. Data are accessed from the memory cells by selecting a given cell or cells by activating bit lines and word lines according to a row and column address. Due to the need to minimize array sizes, memory cells are fabricated with minimal dimensions, and consequently, the data signal provided by the memory cells is relatively small. Commonly, RAMs include a bank of sense amplifiers for receiving the data signals from the memory cells, and amplifying it for use in subsequent data input/output (I/O) path. Because data sensing speeds are a large portion of overall memory device access time, sense amplifiers and I/O paths play a critical role in the overall RAM speed.

U.S. Pat. No. 4,608,670 issued to Duvvury et al. on Aug. 26, 1986, U.S. Pat. No. 4,627,033 issued to Hyslop et al. on Dec. 2, 1986, and U.S. Pat. No. 5,127,739 issued to Duvvury et al., on Jul. 7, 1992 disclose a CMOS sense amplifier having cross-coupled n-channel transistors and cross-coupled p-channel transistors connected between a bit line pair. The sources of the p-channel transistors are coupled to a positive power supply by one or more p-channel coupling devices and the sources of the n-channel transistors are coupled to a low power supply by a number of n-channel coupling devices. In a sensing operation, once a data signals is placed on the bit lines, the first, relatively small n-channel coupling device is activated and the cross-coupled n-channel pair begin pulling one of the bit lines to ground. Subsequently, the second, relatively larger n-channel coupling device is activated, and the cross-coupled n-channel pair begin pulling the low-going bit line to ground at an even faster rate. Finally, either concurrently with, or subsequent to the activation of the larger n-channel coupling device, the p-channel coupling device is activated and the bit line that is not low-going is pulled to Vcc by the p-channel cross-coupled pair. The n and p-channel coupling devices can be shared by all the sense amplifiers in a row, or unique to each sense amplifier. The '739 patent further discloses an arrangement wherein the sense amplifiers can be isolated from the bit lines by isolation transistors.

As RAM sizes continue to grow larger and system clocks continue to get faster, prior art solutions to increasing sensing speed and decreasing sensing current are no longer adequate. It would be desirable to provide a sensing arrangement having sensing speed and sensing current performance beyond that provided by the prior art.

SUMMARY OF THE INVENTION

It is an object of the present invention to provide a sensing circuit having an increased sensing speed.

It is another object of the present invention to provide a sensing circuit that reduces sensing circuit current.

According to the present invention, a sensing circuit for a RAM includes a first latching circuit for pulling one bit line of a bit line pair to high power supply voltage, a second latching circuit for pulling the second bit line of the bit line pair to a low power supply voltage, and a column passgate for coupling the bit lines to I/O lines. In addition, a third latching circuit, operating in synchronism with the passgate, is provided for further driving one of the bit lines to one of the power supply voltages.

Further, according to the present invention, a fourth latching circuit is disposed between the I/O lines for pulling one of the I/O lines to one of the power supplies when a bit line pair is coupled to the I/O lines.

Further according to the present invention, a sense amplifier passgate is situated between the first latching circuit and the second latching circuit to isolate the bit line capacitance from the remainder of the sensing circuits.

Other objects and advantages of the present invention will become apparent in light of the following description thereof.

BRIEF DESCRIPTION OF THE DRAWINGS

FIG. 2b is a timing diagram illustrating the operation of the embodiment set forth in FIG. 2a.

FIG. 3b is a timing diagram illustrating the operation of the embodiment set forth in FIG. 3a.

DETAILED DESCRIPTION OF THE EMBODIMENTS

Figure 1:
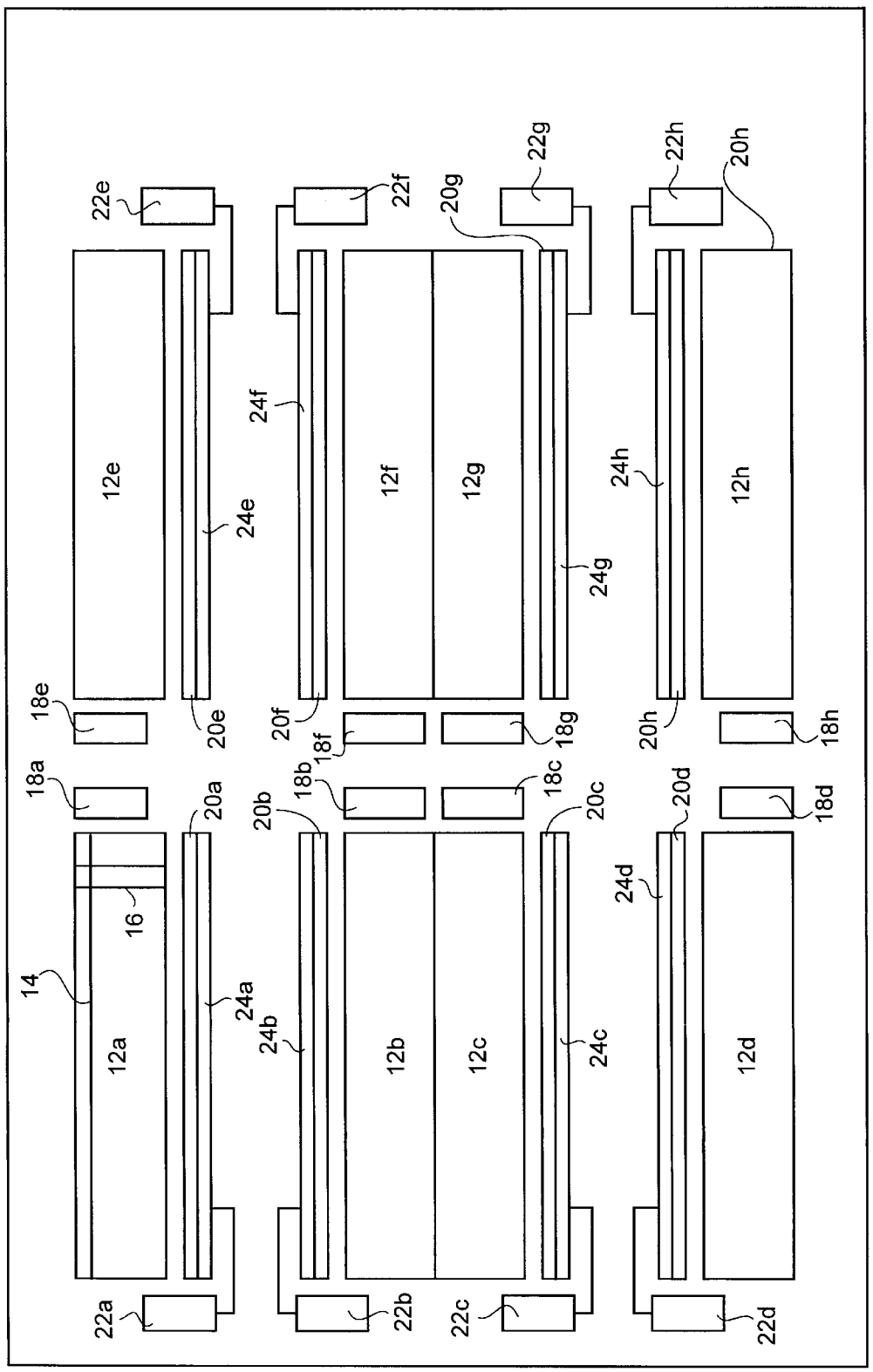
FIG. 1 is a block diagram illustrating a dynamic RAM according to the present invention.

FIG. 1 sets forth, generally, a dynamic random access memory (DRAM) incorporating a sensing scheme according to the present invention. The DRAM is designated by the general reference character 10 and shown to includes a plurality of array blocks 12a–h. As is well understood in the art, each array block 12a–h includes a plurality of memory cells arranged in a matrix of cell rows and columns. The cells within each array block are accessed by a number of word lines arranged generally parallel to the cell rows, and a number of bit lines, arranged generally parallel to the cell columns. An exemplary word line 14 and bit line 16 in array block 12a are set forth in FIG. 1. The preferred embodiment is of a "folded" bit line configuration, with memory cell data being read from and written to by bit line pairs.

Adjacent to each array block 12a–h, perpendicular to the word lines 14 therein, is a corresponding row decoder circuit 18a–h. According to well understood techniques, a portion of an externally applied address is pre-decoded and applied to the row decoder circuits 18a–h which, in response, activate a selected word lines 14. In the preferred embodiment, in any given read or write cycle, some or all of the array blocks 12a–h are active (i.e., have a word line driven), and data are read from selected active array blocks.

Adjacent to each array block 12a–h, running parallel to the word lines 14, is a sense amplifier bank 20a–h. Each sense amplifier bank 20 includes a plurality of sense amplifiers coupled to the bit lines 16 for sensing the data signals placed thereon. Due to the folded bit line arrangement, each sense amplifier is situated between a pair of bit lines, referred to hereinafter as "BIT" and "BIT_". In addition, in the preferred embodiment, there is a one-to-one correspondence between bit line pairs and sense amplifiers. One skilled in the art would recognize that more than one bit line (or bit line pair) could be coupled to each sense amplifier by a multiplexing scheme. Each sense amplifier bank 20a–h is coupled to a secondary sense amplifier bank 22a–h by a column decoder circuit 24a–h. Like the row decoder circuits 18a–h, as is well understood in the art, a portion of a pre-decoded externally applied address is applied to the column decoder circuit 24a–h to couple selected bit lines 14 to the secondary sense amplifier banks 22a–h.

Figure 2A:
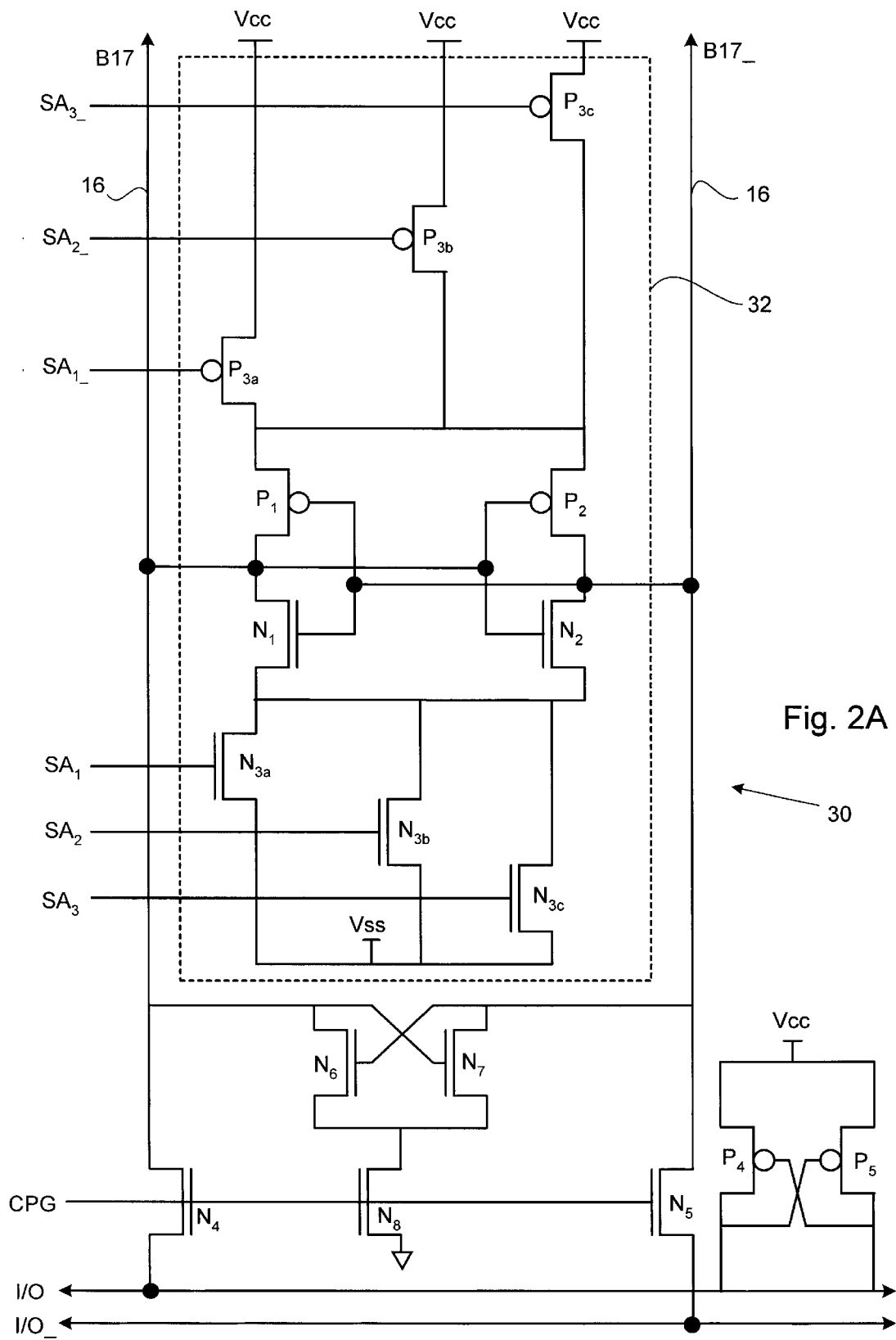
FIG. 2a is schematic diagram of a sensing circuit according to one embodiment of the present invention.

Referring now to FIG. 2a, a schematic diagram is set forth illustrating a sense circuit 30 according to one embodiment of the present invention. One pair of bit lines 16 (BIT and BIT_) from an array block 12 are shown coupled to a CMOS sense amplifier (amp) 32. The CMOS sense amp 32 includes a first pair of cross-coupled p-channel transistors (P1 and P2) and a pair of cross-coupled n-channel transistors (N1 and N2). The cross-coupled node is formed by the drain of P1, the drain of N1, and the gates of P2 and N2 are coupled to BIT. Similarly, the cross-coupled node is formed by the drain of P2, the drain of N2, and the gates of P1 and N1 are coupled to BIT_. In addition, the CMOS sense amp 32 includes three high power supply coupling transistors (P3a–c) for coupling the common sources of P1 and P2 to a high power supply (Vcc) in response to sense amp activation signals SA1_–SA3_. Three low power supply coupling transistors (N3a–c) couple the common sources of N1 and N2 to a low power supply (Vss) in response to sense amp activation signals SA1–3. The sizes of P3a–c vary with P3a being the smallest device and P3c being the largest device. The same holds true for N3a–c; N3a is the smallest and N3c is the largest.

The BIT and BIT_ lines are coupled to an I/O and I/O_ line, respectively, by a column passgate formed from two n-channel transistors (N4 and N5). The column passgate is activated by a column decode signal (CPG) which is derived from the column decode circuit 24 in FIG. 1. The I/O and I/O_ lines are coupled to a secondary sense amplifier (not shown). It is understood that any one of a plurality of bit lines are coupled to the same I/O line pair according to the decoding signal. In the preferred embodiment, one bit line pair of 1024 is coupled to an I/O line in any read/write operation.

The present invention further includes a secondary cross-coupled pair of n-channel transistors (N6 and N7) coupled to the BIT and BIT_. The cross-coupled node formed by the drain of N6 and the gate of N7 is coupled to the BIT line. The opposing cross-coupled node is connected to the BIT_ line. The common sources of N5 and N6 are coupled to Vss via n-channel transistor N8. As set forth in FIG. 2a, the gates of N4, N5 and N8 are commonly driven by the CPG signal.

Figure 2B:
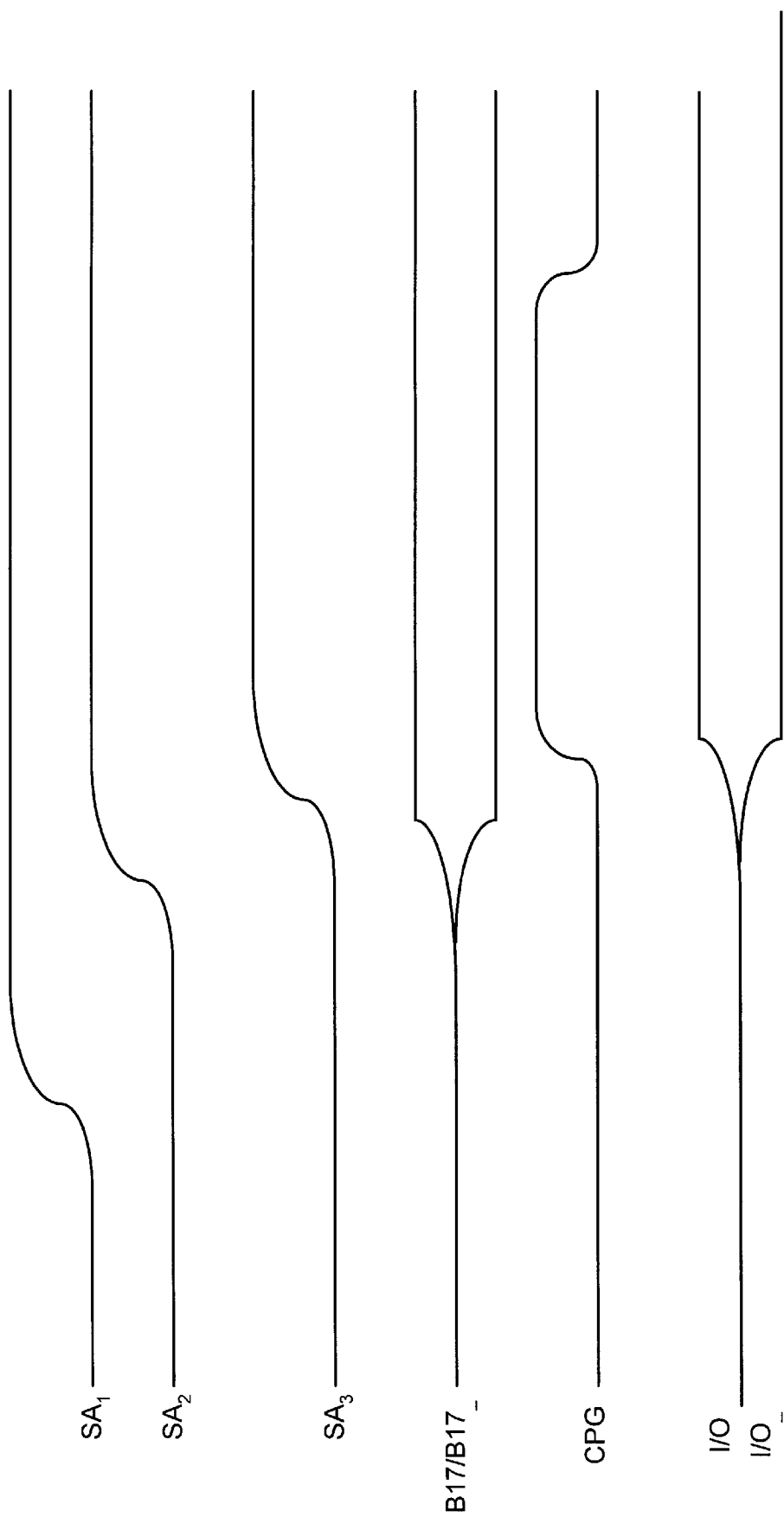

The embodiment set forth in FIG. 2a includes a further cross-coupled pair of p-channel transistors (P4 and P5). A first cross-coupled node formed by the drain of P4 and the gate of P5 is coupled to the I/O line, and the opposing cross-coupled node is coupled to the I/O_ line Reference is now made to FIG. 2b in conjunction with FIGS. 1 and 2a to describe the operation of the sense circuit 30. Upon receiving a Row Address Strobe signal (RAS) and a corresponding row address, the row decoder circuits 18 drive selected word lines 14. In the preferred embodiment, the driven word lines 14 couples one memory cell to one bit line (BIT or BIT_) and a reference voltage (Vref) to the other bit line. In response to the memory cell being coupled to the bit line, the bit line is charged or discharged, and correspondingly rises or falls in potential with respect to the opposite bit line.

According to a predetermined timing scheme, the sense amplifiers are activated shortly thereafter by the consecutive sense clocks SA1–SA3 (and their corresponding complements (SA1_–SA3_). Initially, only N3a and P3a are turned on, and BIT and BIT_ split (the differential increases) at a first, slower rate, due to the relative size of the transistors. As N3b–c and P3b–c turn on, the bit lines split at a faster rate.

Once a minimum voltage differential is established across the bit lines by the operation of the CMOS sense amplifier 32, the CPG signal goes high simultaneously activating N4, N5 and N8. When N4 and N5 are turned on, the bit lines are coupled to the I/O lines. At the same time, when N8 turns on, the cross-coupled pair N6 and N7 are enabled. As a result, when the additional capacitance of the I/O lines is coupled to the bit line pair by N4 and N5, the cross-coupled pair N6/N7 provides additional driving capability for pulling the low going bit line and its associated I/O line to Vss.

As N6 and N7 drive one bit and I/O line to Vss, the cross-coupled pair P4/P5 provide additional driving capability for pulling the opposing I/O line and bit line to Vcc. Thus, any delay introduced by the additional capacitance of the I/O lines is countered by the action of the latching pair N6/N7 and P4/P5. One skilled in the art would recognize that if layout constraints made the implementation of both of the latching pairs not possible, only one (such and N6/N7 could be employed). Further, the P4/P5 pair could be clocked in conjunction with N6/N7 by the CPG or a similar signal.

Figure 3A:
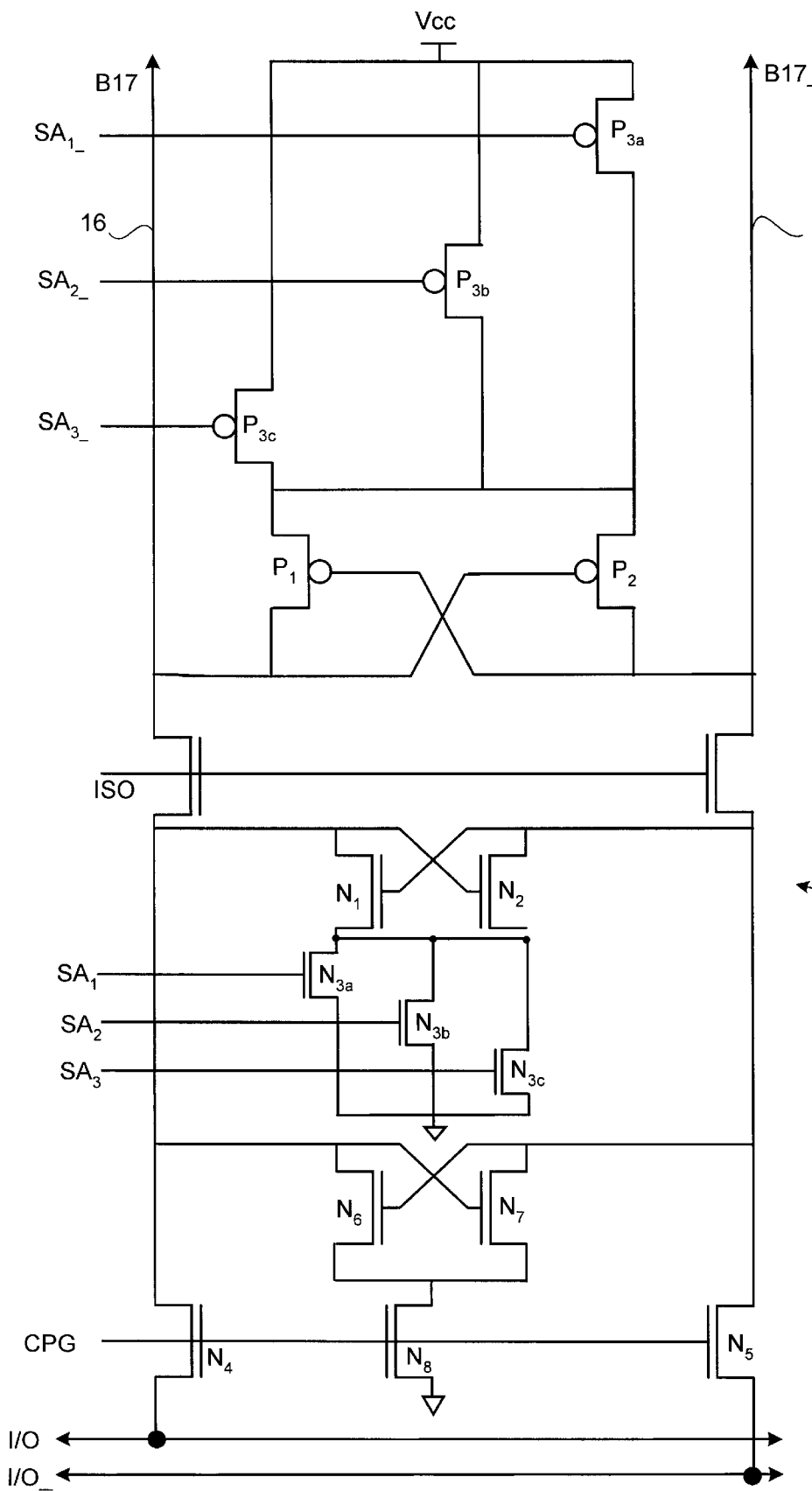
FIG. 3a is schematic diagram of a sensing circuit according to a second embodiment of the present invention.

Referring now to FIG. 3a, a second embodiment of the present invention is set forth. The second embodiment includes some of the same elements as the first embodiment, and so accordingly, like elements will be referred to the same reference characters. The sense circuit according the second embodiment is designated by the general reference character 40, and, like the embodiment of FIG. 2a, is shown to include a CMOS sense amp 32 having a cross-coupled pair of p-channel transistors (P1/P2), a cross-coupled pair of n-channel transistors (N1/N2), and power supply transistors P3a–c and N3a–c. The second embodiment also includes a secondary cross-coupled pair of n-channel transistors (N6 and N7) activated in conjunction with a passgate (N4–N5). Unlike the embodiment of FIG. 2a, the second embodiment includes an isolation gate of n-channel transistors (N9 and N10) which isolate the cross-coupled p-channel nodes (drains of P1/P2) of the CMOS sense amp 32 from the cross-coupled n-channel nodes (drains of N1/N2). The gates of N9 and N10 are commonly driven by an isolation signal ISO.

Figure 3B:
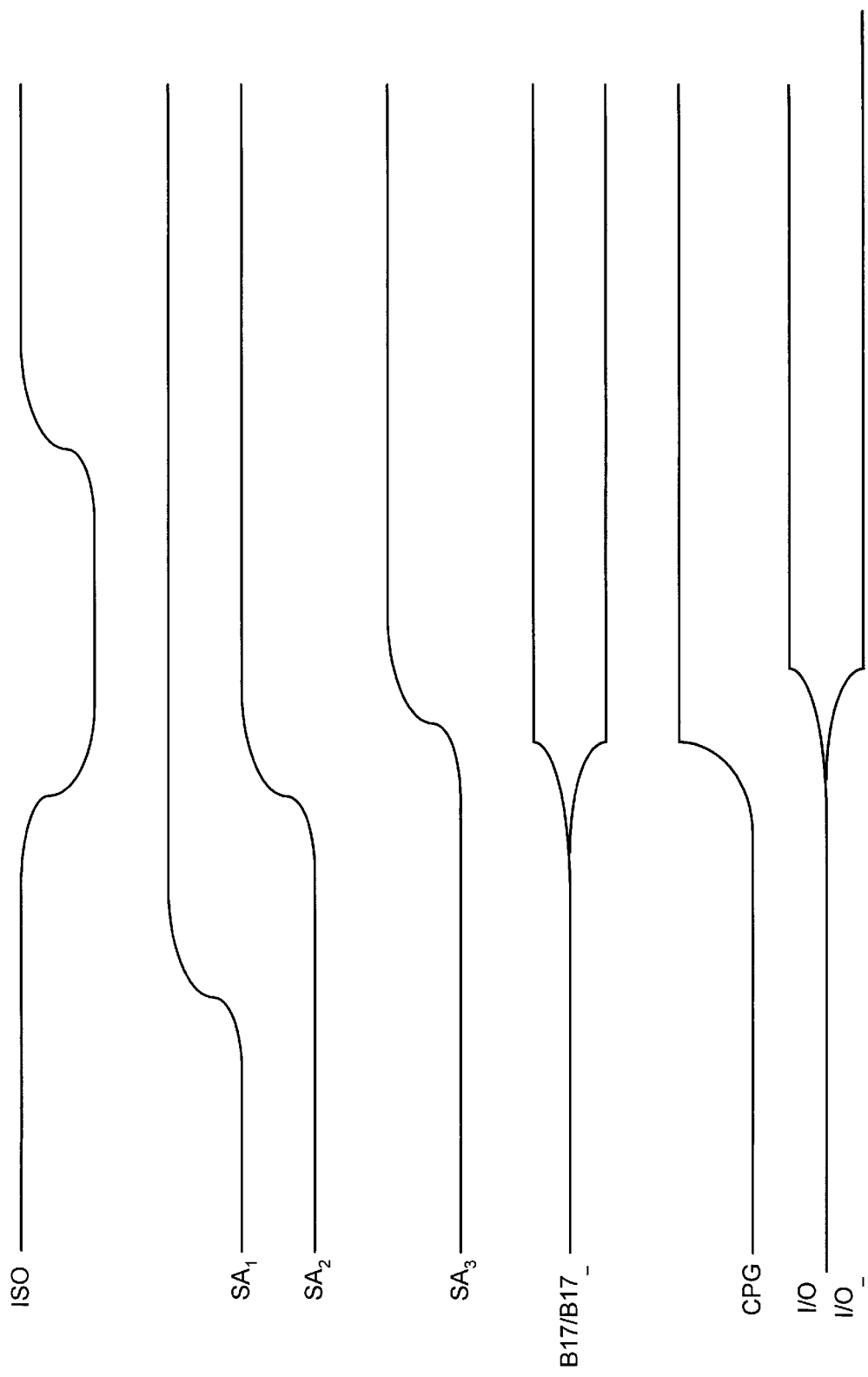

Referring now to FIG. 3b in conjunction with FIG. 3a, the operation of the second embodiment will be described. At the start of a sense operation, ISO is high, and the isolation gate is open. As the word line is driven high, the cell data results in a voltage differential between BIT and BIT_. SA1 goes high and SA1_ goes low, and the N3a and P3a turn on, enabling cross-coupled pairs N1/N2 and P1/P2. The combined action of cross-coupled pairs P1/P2 and N1/N2 begin splitting the bit lines at a first rate. SA2 and SA2_ go active providing a higher gain to the sense amplifier and the bit lines split at a second, faster rate. ISO then goes low, isolating the capacitance of the bit line from the remainder of the circuit 40. SA3 and SA3_ turn on P3c and N3c, and then CPG goes high. Cross-coupled pair N6/N7 drive one of the I/O lines to ground in response to the bit line differential. The I/O line driving action is faster in the embodiment of FIG. 3b than in FIG. 3a due to the isolation of the bit lines. Once the secondary sense amplifier (not shown) has latched the data on the I/O lines, the ISO signal goes high again, coupling the bit lines back to the I/O lines.

While not present in the second embodiment, a clocked, or non-clocked pair of cross-coupled p-channel transistors could be coupled between the I/O lines, as is illustrated in FIG. 2a.

It is understood that the embodiments set forth herein are only some of the possible embodiments of the present invention, and that the invention may be changed, and other embodiments derived, without departing from the spirit and scope of the invention. Accordingly, the invention is intended to be limited only by the appended claims.

What we claim is:

1. In a random access memory having at least one array that includes a plurality of folded bit lines, a data sensing circuit, comprising:

a sense amplifier coupled between at least one folded bit line pair for amplifying a differential signal between the bit line pair;

a pair of passgate transistors responsive to a passgate clock signal for coupling the amplified differential signal from said sense amplifier to a pair of input/output (I/O) lines;

a first latching circuit coupled between the folded bit line pair being responsive to the passgate clock signal arranged to latch at least one of said bit lines to a first voltage in response to the amplified differential signal between the bit lines; and a second latching circuit coupled between the pair of I/O lines arranged to latch at least one of the I/O lines to a second voltage in response to the amplified differential signal between the bit lines.

2. The data sensing circuit of claim 1, wherein said sense amplifier includes, a pair of cross-coupled n-channel transistors having cross coupled nodes coupled to the bit line pairs and a common node coupled to a low power supply voltage;

a pair of cross-coupled p-channel transistors having cross coupled nodes coupled to the bit line pairs and a common node coupled to a high power supply voltage.

3. The data sensing circuit of claim 1, wherein said sense amplifier includes, a pair of cross-coupled p-channel transistors having cross coupled nodes coupled to a first section of the bit line pair and a high power supply voltage common node coupled to a high power supply voltage;

a pair of cross-coupled n-channel transistors having cross-coupled nodes coupled to a second portion of the bit line pair and a low power supply voltage common node coupled to a low power supply voltage; and a pair of sense isolation gates coupling the first portion of the bit line pair to the second portion of the bit line pair.

4. The data sensing circuit of claim 1, wherein the first latching circuit includes, a pair of cross-coupled n-channel transistors having cross-coupled nodes coupled to the bit line pairs, and a low power supply voltage common node coupled to a low power supply voltage by a coupling device.

5. The data sensing circuit of claim 4, wherein said pair of passgate transistors is a pair of n-channel passgate transistor each of which has an n-channel passgate transistor gate, wherein the coupling device is an n-channel coupling transistor having an n-channel coupling transistor gate, and wherein n-channel passgate transistor gates and the n-channel coupling transistor gate are commonly activated by the passgate clock signal.

6. The data sensing circuit of claim 1, wherein said second latching circuit includes, a pair of cross-coupled p-channel transistors having cross-coupled nodes that are, in turn, coupled to the pair of I/O lines, and a high power supply voltage common node coupled to a high power supply voltage.

7. In a semiconductor memory device having a plurality of memory cells arranged in rows and columns, wherein data are read from the memory cells by activating a word line to place memory cell data on bit line pairs, an apparatus for sensing the memory data, comprising:

means for amplifying data on bit line pairs to generate a sensed data signal on sense output node pairs;

means for coupling the sense output node pairs to selected input/output (I/O) line pairs in response to an I/O select signal;

a first means for latching at least one of said bit lines to a first potential in response to the amplified differential signal between the bit lines in response to a passgate clock signal; and a second means for latching at least one of the I/O lines to a second potential in response to the amplified differential signal between the bit lines.

8. The sensing apparatus of claim 7, wherein said means for amplifying data includes means for driving one of the bit lines of the bit line pairs to a first potential in response to the memory cell data; and means for driving the other bit line of the bit line pairs to a second potential in response to the memory cell data.

9. The sensing apparatus of claim 7, wherein said means for amplifying data includes, means for driving one of the bit lines of the bit line pairs to a first potential in response to the memory cell data so as to drive the bit lines to an initial sense state;

means for gating the bit line pairs to the sense output node pairs; and third means for driving one of the sense output nodes of each sense output node pair to a second potential in response to the initial sense state on the bit line pairs.

10. The sensing apparatus of claim 9, further including fourth means for driving one of the sense output nodes of each sense output node pair to the second potential in synchronism with the activation of said means for coupling.

11. The sensing apparatus of claim 7, further including means for driving one of the sense output nodes of each sense output node pair to the second potential in synchronism with the activation of said means for coupling the sense output node pairs to selected input/output (I/O).

12. In a random access memory having at least one array that includes a plurality of folded bit lines, a method of sensing data; comprising:

amplifying a differential signal between the bit line pair by a sense amplifier coupled between at least one folded bit pair line;

coupling the amplified differential signal from said sense amplifier to a pair of input/output (I/O) lines by a pair of passgate transistors in response to a passgate clock signal;

latching at least one of said bit lines to a first voltage in response to the amplified differential signal between the bit lines by a first latching circuit coupled between the folded bit line pair in response to the passgate clock signal; and latching at least one of the I/O lines to a second voltage in response to the amplified differential signal between the bit lines being coupled to the I/O lines by a second latching circuit coupled between the pair of I/O lines.

13. A method as recited in claim 12, wherein said sense amplifier includes, a pair of cross-coupled n-channel transistors having cross-coupled nodes coupled to the bit line pairs and a low power supply voltage common node coupled to a low power supply voltage; and a pair of cross-coupled p-channel transistors having cross-coupled nodes coupled to the bit line pairs and a high power supply voltage common node coupled to a high power supply voltage.

14. A method as recited in claim 12, wherein said sense amplifier further includes, a pair of cross coupled p-channel transistors having cross-coupled nodes coupled to a first section of the bit line pair and a high power supply voltage common node coupled to a high power supply voltage, a pair of cross coupled n-channel transistors having cross-coupled nodes coupled to a second portion of the bit line pair and a low power supply voltage common node coupled to a low power supply voltage, and a pair of sense isolation gates coupling the first portion of the bit line pair to the second portion of the bit line pair.

15. A method as recited in claim 12, wherein the first latching circuit includes a pair of cross-coupled n-channel devices having cross-coupled nodes coupled to the bit line pairs and a low power supply voltage common node coupled to a low power supply voltage by a coupling device.

16. The data sensing circuit of claim 15, wherein said pair of passgate transistors is a pair of n-channel passgate transistors each of which has an n-channel passgate transistor gate, wherein the coupling device is an n-channel coupling transistor having an n-channel coupling transistor gate, and wherein the n-channel passgate transistor gates and the n-channel coupling transistor gate are commonly activated by the passgate clock signal.

17. A method as recited in claim 16, wherein said second latching circuit includes, a pair of cross-coupled p-channel devices having cross-coupled nodes that are, in turn, coupled to the pair of I/O lines, and a high power supply voltage common node coupled to a high power supply voltage.

* * * * *